United States Patent [19]
Laskaris et al.

[11] Patent Number: 5,999,075
[45] Date of Patent: Dec. 7, 1999

[54] OPEN MAGNET WITH SHIELDING

[75] Inventors: Evangelos Trifon Laskaris, Niskayuna; Michael Anthony Palmo, Jr., Ballston Spa, both of N.Y.

[73] Assignee: General Electric Company, Schenectady, N.Y.

[21] Appl. No.: 09/199,095

[22] Filed: Nov. 24, 1998

Related U.S. Application Data

[63] Continuation-in-part of application No. 09/035,639, Mar. 5, 1998, Pat. No. 5,874,880.

[51] Int. Cl.$^6$ ........................................ H01F 5/00
[52] U.S. Cl. .......................................... 335/299; 335/300
[58] Field of Search .................................... 335/216, 299, 335/300; 324/318, 319, 320, 321; 305/844, 876

[56] References Cited

U.S. PATENT DOCUMENTS 5,436,607  7/1995  Chari et al. .............................. 335/216
5,570,073  10/1996  Mueller .................................... 335/299
5,721,523  2/1998  Dorri et al. ............................. 335/216

*Primary Examiner*—Lincoln Donovan
*Attorney, Agent, or Firm*—Douglas E. Erickson; Marvin Snyder

[57] ABSTRACT

An open magnet useful in magnetic resonance imaging (MRI) applications. The magnet has two spaced-apart assemblies. Each assembly has a shielding coil located longitudinally outward from a main coil and a magnetizable pole piece spaced apart from and proximate the main and shielding coils. The method of the invention generates a magnetic field in a first area between the two assemblies while shielding a second area not between the two assemblies from a stray magnetic field by creating the previously-described open magnet.

5 Claims, 4 Drawing Sheets

OPEN MAGNET WITH SHIELDING

CROSS-REFERENCE RELATED APPLICATIONS

The present patent application is a continuation-in-part application of U.S. patent application Ser. No. 09/035,639 by Evangelos T. Laskaris et al. which is entitled "Shielded And Open Superconductive Magnet" and which was filed Mar. 5, 1998 (and which issued as U.S. Pat. No. 5,874,880 on Feb. 23, 1999).

FIELD OF THE INVENTION

The present invention relates generally to an open magnet used to generate a uniform magnetic field, and more particularly to such a magnet having shielding to protect the area around the magnet from stray magnetic fields originating from the magnet.

BACKGROUND OF THE INVENTION

Magnets include resistive and superconductive magnets which are part of a magnetic resonance imaging (MRI) system used in various applications such as medical diagnostics. Known superconductive magnets include liquid-helium-cooled and cryocooler-cooled superconductive magnets. Typically, the superconductive coil assembly includes a superconductive main coil surrounded by a first thermal shield surrounded by a vacuum enclosure. A cryocooler-cooled magnet typically also includes a cryocooler coldhead externally mounted to the vacuum enclosure, having its first cold stage in thermal contact with the thermal shield, and having its second cold stage in thermal contact with the superconductive main coil. A liquid-helium-cooled magnet typically also includes a liquid-helium vessel surrounding the superconductive main coil and a second thermal shield which surrounds the first thermal shield which surrounds the liquid-helium vessel.

Known resistive and superconductive magnet designs include closed magnets and open magnets. Closed magnets typically have a single, tubular-shaped resistive or superconductive coil assembly having a bore. The coil assembly includes several radially-aligned and longitudinally spaced-apart resistive or superconductive main coils each carrying a large, identical electric current in the same direction. The main coils are thus designed to create a magnetic field of high uniformity within a typically spherical imaging volume centered within the magnet's bore where the object to be imaged is placed. A single, tubular-shaped shielding assembly may also be used to prevent the high magnetic field created by and surrounding the main coils from adversely interacting with electronic equipment in the vicinity of the magnet. Such shielding assembly includes several radially-aligned and longitudinally spaced-apart resistive or superconductive shielding coils carrying electric currents of generally equal amperage, but in an opposite direction, to the electric current carried in the main coils and positioned radially outward of the main coils.

Open magnets, including "C" shape magnets, typically employ two spaced-apart coil assemblies with the space between the assemblies containing the imaging volume and allowing for access by medical personnel for surgery or other medical procedures during magnetic resonance imaging. The patient may be positioned in that space or also in the bore of the toroidal-shaped coil assemblies. The open space helps the patient overcome any feelings of claustrophobia that may be experienced in a closed magnet design. Known open magnet designs having shielding include those wherein each coil assembly has an open bore and contains a resistive or superconductive shielding coil positioned longitudinally and radially outward from the resistive or superconductive main coil(s). In the case of a superconductive magnet, a large amount of expensive superconductor is needed in the main coil to overcome the magnetic field subtracting effects of the shielding coil. Calculations show that for a 0.75 Tesla magnet, generally 2,300 pounds of superconductor are needed yielding an expensive magnet weighing generally 12,000 pounds. The modest weight makes this a viable magnet design.

It is also known in open magnet designs to place an iron pole piece in the bore of a resistive or superconductive coil assembly which lacks a shielding coil. The iron pole piece enhances the strength of the magnetic field and, by shaping the surface of the pole piece, magnetically shims the magnet improving the homogeneity of the magnetic field. An iron return path is used to connect the two iron pole pieces. It is noted that the iron pole piece also acts to shield the magnet. However, a large amount of iron is needed in the iron pole piece to achieve shielding in strong magnets. In the case of a superconductive magnet, calculations show that for a 0.75 Tesla magnet, only generally 200 pounds of superconductor are needed yielding a magnet weighing over 70,000 pounds which is too heavy to be used in medical facilities such as hospitals. The weight does not make this a viable magnet design.

What is needed is an open magnet design having shielding which is light enough to be used in medical facilities and which is less expensive than known designs.

SUMMARY OF THE INVENTION

In a first embodiment, the open magnet of the invention includes a first assembly and a second assembly longitudinally spaced apart from the first assembly. The first assembly includes a generally longitudinally-extending first axis, at least one main coil, at least one shielding coil, and at least one magnetizable pole piece. The at least one main coil, the at least one shielding coil, and the at least one magnetizable pole piece are generally coaxially aligned with the first axis. The at least one main coil carries a first main electric current in a first direction, and the at least one shielding coil carries a first shielding electric current in a direction opposite to the first direction. The at least one shielding coil is positioned longitudinally outward from the at least one main coil. The at least one magnetizable pole piece is spaced apart from and proximate the at least one main and shielding coils.

The second assembly includes a generally longitudinally-extending second axis which is generally coaxially aligned with the first axis, at least one main coil, at least one shielding coil, and at least one magnetizable pole piece. The at least one main coil, the at least one shielding coil, and the at least one magnetizable pole piece are generally coaxially aligned with the second axis. The at least one main coil carries a first main electric current in the previously-described first direction, and the at least one shielding coil carries a first shielding electric current in the previously-described opposite direction. The at least one shielding coil is positioned longitudinally outward from the at least one main coil. The at least one magnetizable pole piece is spaced apart from and proximate the at least one main and shielding coils.

In a first example, the method of the invention, for generating a magnetic field in a first area between a first and second assembly while shielding a second area not between said first and second assembly from a stray magnetic field emanating from the generation of the magnetic field in said first area, includes several steps. A step includes positioning as a first assembly at least one main coil, at least one shielding coil, and at least one magnetizable pole piece, wherein the at least one main coil carries a first electric current in a first direction, wherein the at least one shielding coil is located longitudinally outward from the at least one main coil and carries a first shielding electric current in a direction opposite to the first direction, and wherein the at least one magnetizable pole piece is spaced apart from and proximate the at least one main and shielding coils. Another step includes positioning as a second assembly at least one main coil, at least one shielding coil, and at least one magnetizable pole piece, wherein the at least one main coil carries a second electric current in the previously-described first direction, wherein the at least one shielding coil is located longitudinally outward from the at least one main coil and carries a second shielding electric current in the previously-described opposite direction, and wherein the at least one magnetizable pole piece is spaced apart from the at least one main and shielding coils. An additional step is generally coaxially aligning the at least one main and shielding coils and pole piece of the first and second assemblies with a generally longitudinally-extending axis. A further step is longitudinally spacing apart the second assembly from the first assembly.

Several benefits and advantages are derived from the invention. The at least one pole piece enhances the strength of the magnetic field so less conductor or superconductor is needed in the at least one main coil. The portion of the at least one pole piece proximate the at least one main coil provides a partial magnetic flux return for the at least one main coil which reduces the magnetizable material needed in the at least one pole piece and which reduces the amount of conductor or superconductor needed in the at least one main coil. The portion of the at least one pole piece proximate the at least one shielding coil also magnetically decouples the at least one shielding coil from the at least one main coil so that the magnetic flux lines from the at least one shielding coil are captured by the portion of the at least one pole piece proximate the at least one shielding coil and do not reach the magnetic flux lines from the at least one main coil. Thus the magnetizable mass of the at least one pole piece does not have to be increased, and the amount of the conductor or superconductor in the at least one main coil does not have to be increased, to offset the field subtracting effects of the magnetic flux lines from the at least one shielding coil, since they are blocked by the presence of the portion of the at least one pole piece proximate the at least one shielding coil. In the case of a superconductive magnet, computer simulations show that a 0.75 Tesla magnet of the present invention would use generally 750 pounds of superconductor yielding a magnet weighing generally 15,000 pounds (which is light enough to be installed in a medical facility) and costing only half or less of what a viable equivalent conventional magnet would cost.

DETAILED DESCRIPTION OF THE INVENTION

Figure 1:
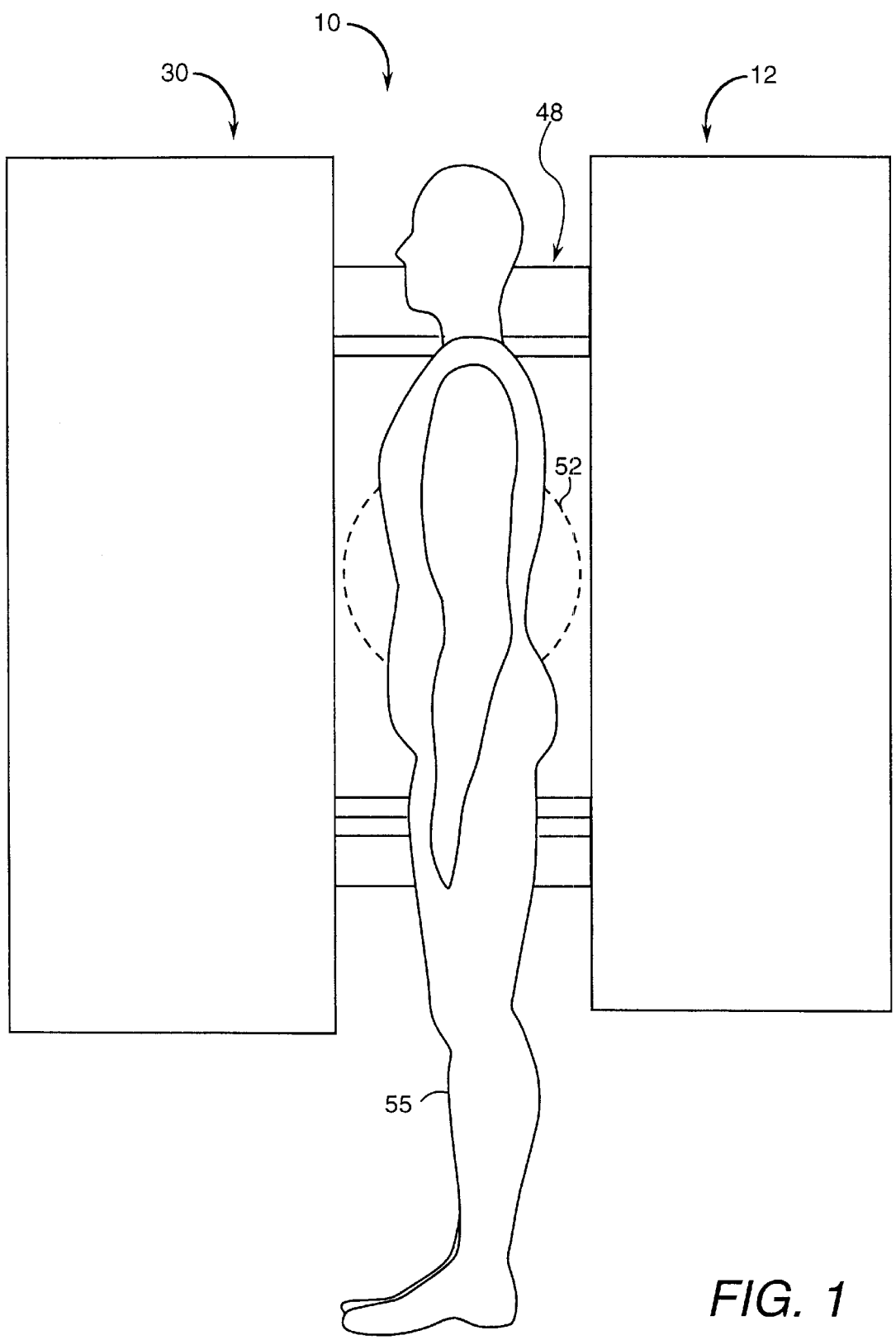
FIG. 1 is a schematic front elevational view of a first preferred embodiment of the open magnet of the invention.
Figure 2:
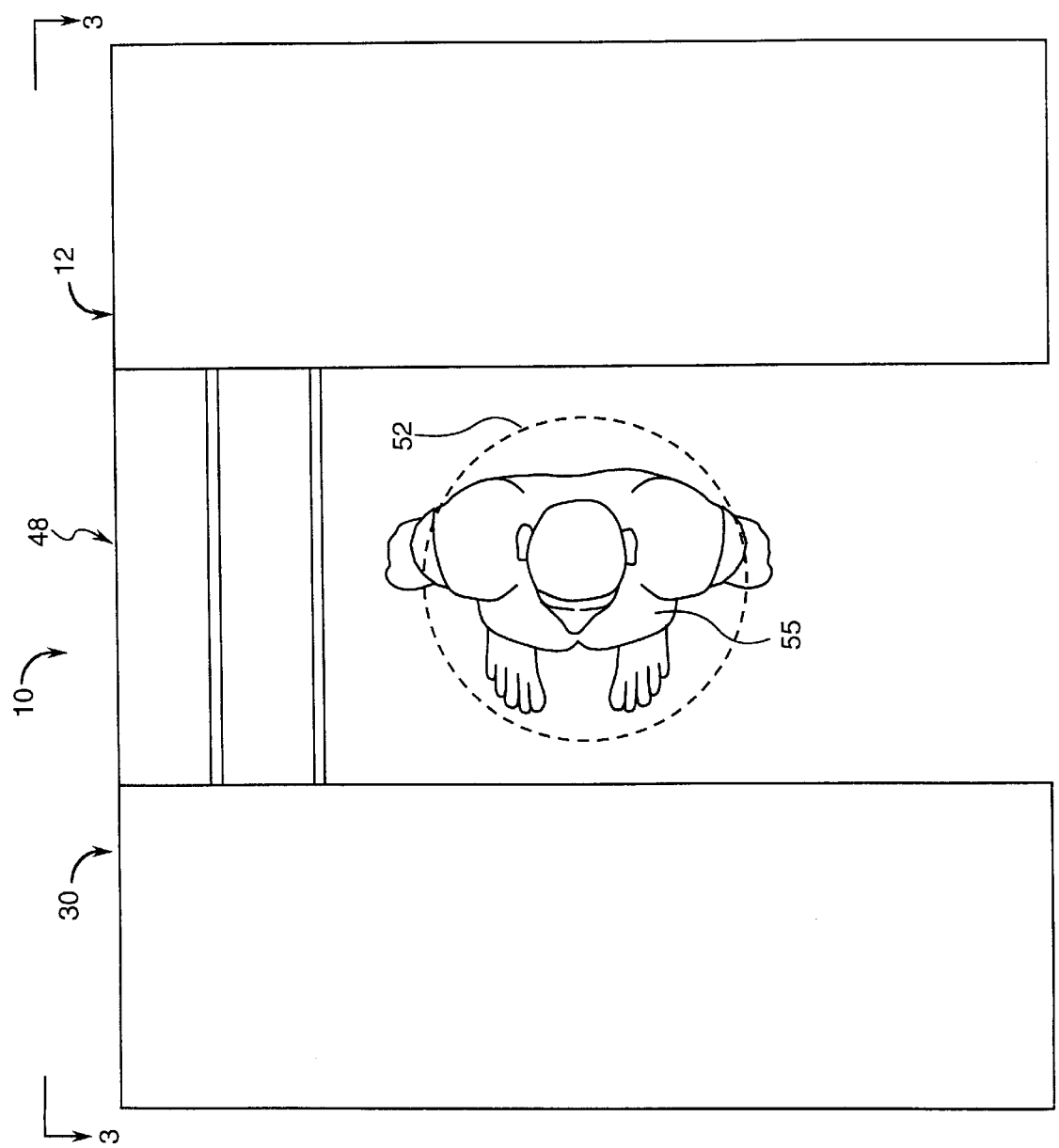
FIG. 2 is a schematic top planar view of the magnet of FIG. 1.

Referring now to the drawings, wherein like numerals represent like elements throughout, FIGS. 1–4 show a first embodiment of the open magnet 10 of the present invention. Magnet 10 is a superconductive magnet. In an example, the magnet 10 is a 0.5 or higher Tesla magnet. The magnet 10 includes a first assembly 12. The first assembly 12 includes a generally annular-shaped first superconductive main coil 14 having a generally longitudinal first axis 16, having a longitudinally inner end 18, and having a longitudinally outer end 20. The first superconductive main coil 14 carries a first main electric current in a first direction. The first direction is defined to be either a clockwise or a counter-clockwise circumferential direction about the first axis 16 with any slight longitudinal component of current direction being ignored. It is noted that additional first superconductive main coils may be needed to achieve a high magnetic field strength, within the magnet's imaging volume, without exceeding the critical current density of the superconductor being used in the superconductive coils, as is known to those skilled in the art. An example of a superconductor for the first superconductive main coil 14 is niobium-titanium.

The first assembly 12 also includes a generally annular-shaped first superconductive shielding coil 22 generally coaxially aligned with the first axis 16. The first superconductive shielding coil 22 is spaced longitudinally outward and apart from the first superconductive main coil 14 and at least partially radially overlaps the first superconductive main coil 14. For the purposes of describing the invention, a first magnet component is said to "at least partially radially overlap" a second magnet component if the two components would collide as they are moved together, with any intervening magnet components removed, in a direction parallel to the longitudinal axis. It is noted that a first component can completely radially overlap a second component only when the first component has a radial thickness which is equal to, or greater than, the radial thickness of the second component. The first superconductive shielding coil 22 carries a first shielding electric current in a direction opposite to the previously-defined first direction. An example of a superconductor for the first superconductive shielding coil 22 is niobium-titanium.

The first assembly 12 additionally includes a magnetizable and generally cylindrical-shaped first pole piece 24 generally coaxially aligned with the first axis 16 and spaced apart from the first superconductive main and shielding coils 14 and 22. The first pole piece 24 has a first radially-outer portion 26 at least partially radially overlapping the first superconductive main coil 14. The first pole piece 24 also has a first longitudinally-inner portion 28 which has a generally annular shape and which is generally coaxially aligned with the first axis 16. The first longitudinally-inner portion 28 is disposed radially closer to the first radially-outer portion 26 than to the first axis 16, and the first longitudinally-inner portion 28 projects longitudinally inward past the longitudinally outer end 20 of the first superconductive main coil 14. In an example, the first pole piece 24 consists essentially of a ferromagnetic material. In an example, the first pole piece 24 consists essentially of iron.

The open superconductive magnet 10 also includes a second assembly 30. The second assembly 30 includes a generally annular-shaped second superconductive main coil 32 longitudinally spaced apart from the first superconductive main coil 14. The second superconductive main coil 32 has a generally longitudinal second axis 34 generally coaxially aligned with the first axis 16. The second superconductive main coil 32 also has a longitudinally inner end 36 and a longitudinally outer end 38. The longitudinally inner ends 18 and 36 of the first and second superconductive main coils 14 and 32 are longitudinally closer to each other than are the longitudinally outer ends 20 and 38 of the first and second superconductive main coils 14 and 32. The second superconductive main coil 32 carries a second main electric current in the previously-mentioned first direction. It is noted that additional second superconductive main coils may be needed to balance any additional first superconductive main coils present in the first assembly, as is known to those skilled in the art. An example of a superconductor for the second superconductive main coil 32 is niobium-titanium.

The second assembly 30 also includes a generally annular-shaped second superconductive shielding coil 40 generally coaxially aligned with the second axis 34. The second superconductive shielding coil 40 is spaced longitudinally outward and apart from the second superconductive main coil 32 and at least partially radially overlaps the second superconductive main coil 32. The second superconductive shielding coil 40 carries a second shielding electric current in the previously-defined opposite direction. An example of a superconductor for the second superconductive shielding coil 40 is niobium-titanium.

The second assembly 30 additionally includes a magnetizable and generally cylindrical-shaped second pole piece 42 longitudinally spaced apart from, and without a magnetizable solid path to, the first pole piece 24. The second pole piece 42 is generally coaxially aligned with the second axis 34 and is spaced apart from the second superconductive main and shielding coils 32 and 40. The second pole piece 42 has a second radially-outer portion 44 at least partially radially overlapping the second superconductive main coil 32. The second pole piece 42 also has a second longitudinally-inner portion 46 which has a generally annular shape and which is generally coaxially aligned with the second axis 34. The second longitudinally-inner portion 46 is disposed radially closer to the second radially-outer portion 44 than to the second axis 34, and the second longitudinally-inner portion 46 projects longitudinally inward past the longitudinally outer end 38 of the second superconductive main coil 32. In an example, the second pole piece 42 consists essentially of a ferromagnetic material. In an example, the second pole piece 42 consists essentially of iron.

In an exemplary construction, the open superconductive magnet 10 includes only one support member 48 connecting the first and second assemblies 12 and 30, wherein the support member 48 is a nonmagnetizable support member preferably consisting essentially of nonmagnetic stainless steel. In an example, the support member 48 and the first and second assemblies 12 and 30 together have a generally "C" shape when viewed in a cross section created by a cutting plane, wherein the first axis 16 lies completely in the cutting plane, and wherein the cutting plane generally bisects the support member 48. It is noted that the previously-defined cross section is the cross section shown in FIG. 3, with the "C" shape seen by rotating FIG. 3 ninety degrees counterclockwise.

In an example, the second assembly 30 is a general mirror image of the first assembly 12 about a plane 50 (seen on edge as a dashed line in FIG. 3) disposed longitudinally equidistant between the first and second assemblies 12 and 30 and oriented generally perpendicular to the first axis 16. When the magnet 10 is employed as an MRI (magnetic resonance imaging) magnet, the magnet 10 includes a magnetic resonance imaging volume 52 (seen as a dotted line in FIGS. 1–3) disposed generally longitudinally equidistant between the first and second assemblies 12 and 30. In an example, the imaging volume is a generally spherical imaging volume having a center 54 lying generally on the first axis 16. A patient 55 is shown in an imaging position in FIGS. 1 and 2. As is known to the artisan, the magnet 10 and the patient 55 can be rotated ninety degrees clockwise from their positions shown in FIGS. 1 and 2, with the patient suitably supported on a patient table.

It is noted that the superconductive coils 14, 22, 32, and 40 are cooled, to a temperature below their critical temperature to achieve and sustain superconductivity, preferably by liquid-helium (or other cryogenic) cooling, by cryocooler cooling, or by a combination thereof. In a first cooling option, illustrated in the first assembly 12, the magnet 10 also includes a first cryogenic vessel 56 surrounding the first superconductive main and shielding coils 14 and 22, wherein the first pole piece 24 is disposed outside and spaced apart from the first cryogenic vessel 56. The first cryogenic vessel 56 contains a liquid cryogen 58, such as liquid helium. In an example, the first cryogenic vessel 56 consists essentially of aluminum or nonmagnetic stainless steel. Here, the magnet 10 further includes a plurality of plates 60, 62, 64, 66, and 68 which, together with the first pole piece 24 define a first vacuum enclosure 70 which surrounds and which is spaced apart from the first cryogenic vessel 56. In an exemplary construction, the plates 60, 62, 64, 66, and 68 consist essentially of nonmagnetic stainless steel.

In a second cooling option, illustrated in the second assembly 30, the magnet 10 also includes a cryocooler coldhead 72 having a housing 74 attached to the second vacuum enclosure 76 and having a cold stage 78 in solid thermal conduction contact with the second superconductive main and shielding coils 32 and 40. Other cooling options (not shown in the figures) include each assembly having its own cryogenic vessel, wherein the liquid cryogen in one cryogenic vessel is in fluid communication with the liquid cryogen in the other cryogenic vessel through an interconnecting duct separate from the support member. Alternately, a solid thermal conduction path can be placed in the interconnecting duct allowing the cryocooler coldhead on the second vacuum enclosure to also cool the superconductive main and shielding coils in the first vacuum enclosure.

Figure 3:
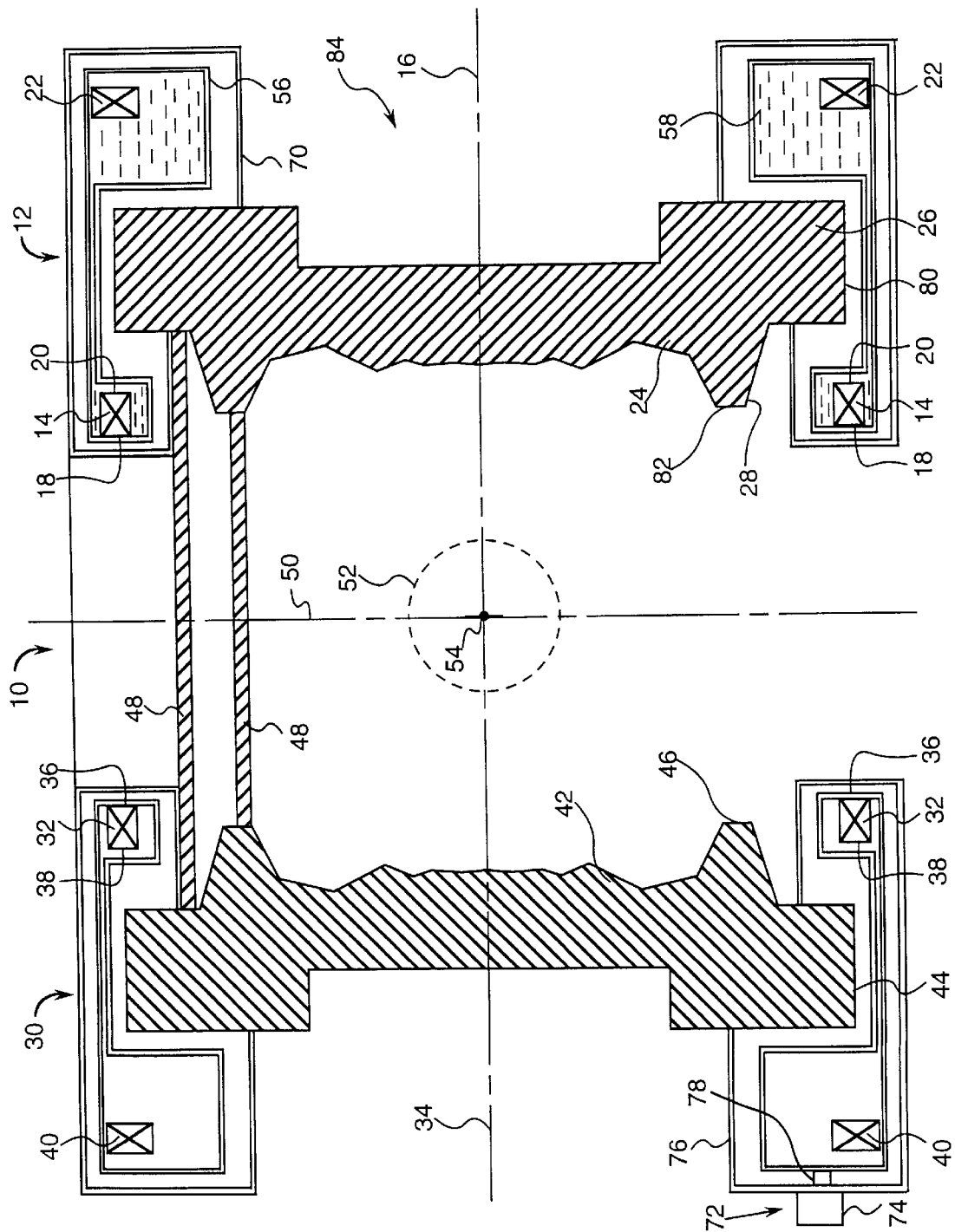
FIG. 3 is a schematic cross sectional view of the magnet of FIGS. 1 and 2 taken along lines 3—3 of FIG. 2 with the addition of a cryocooler coldhead.

In an exemplary embodiment, as seen in FIG. 3, the first radially-outer portion 26 is a radially-outermost portion 80 of the first pole piece 24, and the first longitudinally-inner portion 28 is a longitudinally-innermost portion 82 of the first pole piece 24. In an example, the first superconductive shielding coil 22 is spaced longitudinally-outwardly apart from the first pole piece 24. In an example, the first superconductive shielding coil 22 partially radially overlap the radially-outermost portion 80 of the first pole piece 24 and generally completely radially overlap the first superconductive main coil 14. In an exemplary construction, the longitudinally-innermost portion 82 of the first pole piece 24 projects longitudinally inward past the longitudinally inner end 18 of the first superconductive main coil 14. In an example, the first superconductive main coil 14 is disposed longitudinally closer than the first superconductive shielding coil 22 to the radially-outermost portion 80 of the first pole piece 24. In an exemplary construction, the magnet 10 of FIG. 3 is a generally 0.75 Tesla magnet.

It is noted that those skilled in the art, using computer simulations based on conventional magnetic field analysis techniques, and using the teachings of the present invention, can design a shielded and open magnet of a desired magnetic field strength, a desired level of magnetic field inhomogeneity, and a desired level of shielding (i.e., a desired position of the 5 Gauss stray field from the center of the imaging volume of the open superconductive magnet). It is noted, as shown in FIG. 3, that such analysis shows that a coaxially-aligned disk of iron can be removed from the longitudinally-outer area 84 of the first pole piece 24 without effecting the performance of the magnet 10, as can be appreciated by those skilled in the art. As previously mentioned, the pole piece enhances the strength of the magnetic field so less superconductor is needed in the main coil. The radially-outermost portion of the pole piece provides a partial magnetic flux return for the main coil which reduces the iron needed in the pole piece and which reduces the amount of superconductor needed in the main coil. The radially-outermost portion of the pole piece also magnetically decouples the shielding coil from the main coil so that the magnetic flux lines from the shielding coil are captured by the radially-outermost portion of the pole piece and do not reach the magnetic flux lines from the main coil. Thus the iron mass of the pole piece does not have to be increased, and the amount of the superconductor in the main coil does not have to be increased, to offset the field subtracting effects of the magnetic flux lines from the shielding coil, since they are blocked by the presence of the radially-outermost portion of the pole piece. Computer simulations show that a 0.75 Tesla magnet of the present invention would use generally 750 pounds of superconductor yielding a magnet weighing generally 15,000 pounds (which is light enough to be installed in a medical facility) and costing only half or less of what a viable equivalent conventional magnet would cost.

Figure 4:
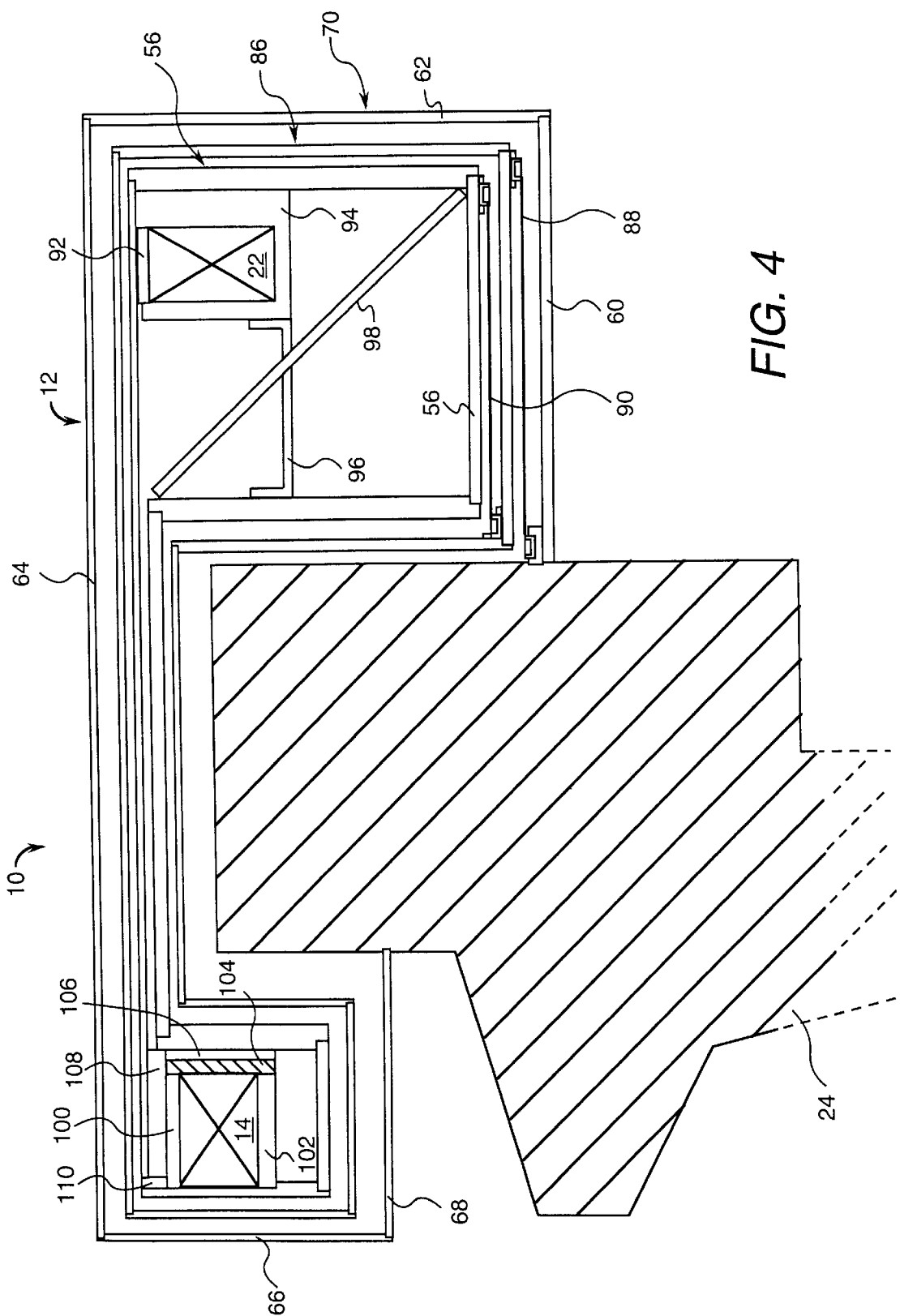
FIG. 4 is a detailed schematic view of a portion of the magnet shown in FIG. 3 without the presence of the liquid cryogen.

Typically one or more thermal shields are spaced apart from, and surround, the superconductive main and shielding coils. For cryogenic-cooling, such thermal shields are located outside the cryogenic vessel. It is noted that the magnet 10 moreover includes, as needed, thermal spacers and coil forms, as is known to the artisan, for proper spacing and support of the magnet components. In an exemplary design, as shown in FIG. 4, the magnet 10 also includes a first thermal shield 86, an inner support cylinder 88, and an outer support cylinder 90. The first thermal shield 86 is disposed between, and spaced apart from, the first cryogenic vessel 56 and the first vacuum enclosure 70. The inner support cylinder 88 is generally coaxially aligned with the first axis 16, is disposed longitudinally outward of the first pole piece 24, has a first end secured to the first vacuum enclosure 70, and has a second end secured to the first thermal shield 86. The outer support cylinder 90 is generally coaxially aligned with the first axis 16, is disposed longitudinally outward of the first pole piece 24, has a first end secured to the first thermal shield 86, and has a second end secured to the first cryogenic vessel 56. Preferably, the inner support cylinder 88 longitudinally extends a distance generally equal to the distance that the first thermal shield 86 longitudinally extends outward from the first pole piece 24, and the outer support cylinder 90 longitudinally extends a distance generally equal to the distance that the first cryogenic vessel 56 longitudinally extends outward from the first pole piece 24. In an exemplary construction, first thermal shield 86 consists essentially of aluminum, and the inner and outer support cylinders 88 and 90 consist essentially of a fiber-reinforced composite such as carbon fiber or glass fiber. In an example, the above-described securing of the ends of the nonmetallic support cylinders is accomplished by forming a rounded rim in the ends of the support cylinders and by using metal rings to capture the rims, some of such rings being attached to the metallic vacuum enclosure, the metallic thermal shield, or the metallic cryogenic vessel, as appropriate and as can be appreciated by the artisan. It is noted that the inner and outer support cylinders 88 and 90 are under tension and provide a superior system for mechanically supporting the magnet components within the first vacuum enclosure 70 against the magnetic forces generated by the magnet 10, as can be understood by those skilled in the art. The first superconductive shielding coil 22 has an aluminum overband 92 (with intervening fiberglass insulation) abutting the first cryogenic vessel 56 and is wound on a fiberglass coil form 94 supported by discrete aluminum brackets 96 (only one of which is shown) attached to the first cryogenic vessel 56. Discrete aluminum diagonal struts 98 (only one of which is shown) internally brace the first cryogenic vessel 56. The first superconductive main coil 14 has an aluminum overband 100 (with intervening fiberglass insulation) and is wound on a fiberglass coil form 102 which is attached to the first cryogenic vessel 56 and which has a flange 104 with helium flow channels 106. There is intervening fiberglass insulation between the first superconductive main coil 14 and the first cryogenic vessel 56. Discrete aluminum brackets 108 (only one of which is shown) and a backup ring 110 surround the overband 100 as shown in FIG. 4.

As will be apparent to the artisan in view of the description of the above embodiments, the magnet of the invention can be more broadly expressed as an open magnet 10 having a first assembly 12 and a second assembly 30 which is longitudinally spaced apart from the first assembly 12. The first assembly 12 includes a generally longitudinally-extending first axis 16, at least one main coil 14, at least one shielding coil 22 disposed longitudinally outward from the at least one main coil 14, and at least one magnetizable pole piece 24. The at least one main coil 14, shielding coil 22, and magnetizable pole piece 24 are generally coaxially aligned with the first axis 16. The at least one main coil 14 carries a first main electric current in a first direction, and the at least one shielding coil 22 carries a first shielding electric current in a direction opposite to the first direction. The at least one magnetizable pole piece 24 is spaced apart from and proximate the at least one main and shielding coils 14 and 22. The second assembly 30 includes a generally longitudinally-extending second axis 34 generally coaxially aligned with the first axis 16, at least one main coil 32, at least one shielding coil 40 disposed longitudinally outward from the at least one main coil 32, and at least one magnetizable pole piece 42. The at least one main coil 32, shielding coil 40, and magnetizable pole piece 42 are generally coaxially aligned with the second axis 34. The at least one main coil 32 carries a second main electric current in the previously-described first direction, and the at least one shielding coil 40 carries a second shielding electric current in the previously-described opposite direction. The at least one magnetizable pole piece 42 is spaced apart from and proximate the at least one main and shielding coils 32 and 40.

The at least one pole piece enhances the strength of the magnetic field so less conductor or superconductor is needed in the at least one main coil. The portion of the at least one pole piece proximate the at least one main coil provides a partial magnetic flux return for the at least one main coil which reduces the magnetizable material needed in the at least one pole piece and which reduces the amount of conductor or superconductor needed in the at least one main coil. The portion of the at least one pole piece proximate the at least one shielding coil also magnetically decouples the at least one shielding coil from the at least one main coil so that the magnetic flux lines from the at least one shielding coil are captured by the portion of the at least one pole piece proximate the at least one shielding coil and do not reach the magnetic flux lines from the at least one main coil. Therefore the magnetizable mass of the at least one pole piece does not have to be increased, and the amount of the conductor or superconductor in the at least one main coil does not have to be increased, to offset the field subtracting effects of the magnetic flux lines from the at least one shielding coil, since they are blocked by the presence of the portion of the at least one pole piece proximate the at least one shielding coil.

Thus, the open magnet 10 is not limited to a superconductive magnet and can be a resistive magnet or a combination resistive and superconductive magnet. Likewise, the at least one main and shielding coils 14 & 32 and 22 and 40 are not limited to superconductive coils and can be resistive or a combination of resistive and superconductive coils. It is noted that the coils 14, 32, 22 and 40 are not limited to being one each, and the open magnet 10 can have two or more main coils 14, two or more main coils 32, two or more shielding coils 22, and two or more shielding coils 40 or any combination of one or more of such coils. Likewise, each at least one pole piece 24 and 42 is not limited in number. The shape of the coils 14, 32, 22, and 40 is not limited to being generally annular, and the shape of the pole pieces 24 and 42 is not limited to being generally cylindrical, and any shape or combination of shapes suitable to creating a desired magnetic field can be used, as is within the design skill of the artisan using the teachings of the present invention.

In an example, the open magnet 10 also includes at least one support member 48 connecting the first and second assemblies 12 and 30. It is noted that the at least one support member 48 is not limited in number, and open magnets of the invention can have one, two, three or any number of support members. It is also noted that the at least one support member 48 is not limited to one which does not provide a magnetizable solid path between the at least one pole piece 42 and the at least one pole piece 24. That is, the at least one pole piece 42 may have no magnetizable solid path to the at least one pole piece 24, or the at least one pole piece 42 may have a magnetizable solid path to the at least one pole piece 24.

In an example, the at least one main coil 14 (whether resistive or superconductive) of the first assembly 12 has a cryogenic temperature during operation of the magnet 10. It is noted that such cryogenic temperature is required when the at least one main coil 14 comprises and relies on a superconductor and is permissive but not required when the at least one main coil 14 comprises a conductor (i.e., a resistive conductor) and does not rely on a superconductor. Likewise, in another example the at least one shielding coil 22 of the first assembly 12 has a cryogenic temperature during operation of the magnet 10. When a component of the first or second assembly 12 or 30 of the magnet 10 (such as a coil) has a cryogenic temperature during magnet operation, the component typically is disposed in a corresponding first or second vacuum enclosure 70 or 76. In the previously-described first cooling option, the component of the first assembly 12 is disposed in a first cryogenic vessel 56 which surrounds the component and which is itself disposed within the first vacuum enclosure 70. It is noted that, for example, a component (such as single coil) can have its own vacuum enclosure (or its own cryogenic vessel and vacuum enclosure) or can share a vacuum enclosure (or a cryogenic vessel and vacuum enclosure) with one or more other components (such as one or more other coils).

From the above description, it will be recognized that the invention can also be expressed as a method for generating a magnetic field in a first area (such as an imaging volume 52) between a first and second assembly 12 and 30 while shielding a second area (such as an area longitudinally and/or radially outward of the assembly pair) not between the first and second assembly 12 and 30 from a stray magnetic field emanating from the generation of the magnetic field in the first area. In one example, the method comprises several steps.

One step is disposing as a first assembly 12 at least one main coil 14, at least one shielding coil 22, and at least one magnetizable pole piece 24, wherein the at least one main coil 14 carries a first electric current in a first direction, wherein the at least one shielding coil 22 is disposed longitudinally outward from the at least one main coil 14 and carries a first shielding electric current in a direction opposite to the first direction, and wherein the at least one magnetizable pole piece 24 is spaced apart from and proximate the at least one main and shielding coils 14 and 22.

Another step is disposing as a second assembly 30 at least one main coil 32, at least one shielding coil 40, and at least one magnetizable pole piece 42, wherein the at least one main coil 32 carries a second electric current in the previously-described first direction, wherein the at least one shielding coil 38 is disposed longitudinally outward from the at least one main coil 32 and carries a second shielding electric current in the previously-described opposite direction, and wherein the at least one magnetizable pole piece 42 is spaced apart from and proximate the at least one main and shielding coils 32 and 40. An additional step is generally coaxially aligning the at least one main and shielding coils 14 & 32 and 22 & 40 and pole piece 24 and 42 of the first and second assemblies 12 and 30 with a generally longitudinally-extending axis 16 or 34. A further step is longitudinally spacing apart the second assembly 30 from the first assembly 12.

The foregoing description of several embodiments and examples of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

What is claimed is:

1. An open magnet comprising:
 a) a first assembly including:
  (1) a longitudinally-extending first axis;
  (2) at least one main coil coaxially aligned with said first axis and carrying a first main electric current in a first direction;
  (3) at least one shielding coil coaxially aligned with said first axis, disposed longitudinally outward from said at least one main coil of said first assembly, and carrying a first shielding electric current in a direction opposite to said first direction; and
  (4) at least one magnetizable pole piece coaxially aligned with said first axis and spaced apart from said at least one main and shielding coils of said first assembly, wherein most of said at least one magnetizable pole piece of said first assembly is disposed longitudinally between and radially inward of said at least one main and shielding coils of said first assembly; and
 b) a second assembly longitudinally spaced apart from said first assembly and including:

(1) a longitudinally-extending second axis coaxially aligned with said first axis;

(2) at least one main coil coaxially aligned with said second axis and carrying a second main electric current in said first direction;

(3) at least one shielding coil coaxially aligned with said second axis, disposed longitudinally outward from said at least one main coil of said second assembly, and carrying a second shielding electric current in said opposite direction; and (4) at least one magnetizable pole piece coaxially aligned with said second axis and spaced apart from said at least one main and shielding coils of said second assembly, wherein most of said at least one magnetizable pole piece of said second assembly is disposed longitudinally between and radially inward of said at least one main and shielding coils of said second assembly.

2. The magnet of claim 1, also including at least one support member connecting said first and second assemblies.

3. The magnet of claim 1, wherein said at least one main coil of said first assembly has a cryogenic temperature during operation of said magnet.

4. The magnet of claim 1, wherein said at least one shielding coil of said first assembly has a cryogenic temperature during operation of said magnet.

5. A method for generating a magnetic field in a first area between a first and second assembly while shielding a second area not between said first and second assembly from a stray magnetic field emanating from the generation of the magnetic field in said first area, the method comprising the following steps:

disposing as a first assembly at least one main coil, at least one shielding coil, and at least one magnetizable pole piece, wherein said at least one main coil of said first assembly carries a first electric current in a first direction, wherein said at least one shielding coil of said first assembly is disposed longitudinally outward from said at least one main coil of said first assembly and carries a first shielding electric current in a direction opposite to said first direction, wherein said at least one magnetizable pole piece of said first assembly is spaced apart from said at least one main and shielding coils of said first assembly, and wherein most of said at least one magnetizable pole piece of said first assembly is positioned longitudinally between and radially inward of said at least one main and shielding coils of said first assembly;

disposing as a second assembly at least one main coil, at least one shielding coil, and at least one magnetizable pole piece, wherein said at least one main coil of said second assembly carries a second electric current in said first direction, wherein said at least one shielding coil of said second assembly is disposed longitudinally outward from said at least one main coil of said second assembly and carries a second shielding electric current in said opposite direction, wherein said at least one magnetizable pole piece of said second assembly is spaced apart from said at least one main and shielding coils of said second assembly, and wherein most of said at least one magnetizable pole piece of said second assembly is positioned longitudinally between said at least one main and shielding coils of said second assembly;

coaxially aligning said at least one main and shielding coils and pole piece of said first and second assemblies with a longitudinally-extending axis; and longitudinally spacing apart said second assembly from said first assembly.

* * * * *